United States Patent [19]

Thomson

[11] Patent Number: 4,700,144

[45] Date of Patent: Oct. 13, 1987

[54] DIFFERENTIAL AMPLIFIER FEEDBACK CURRENT MIRROR

[75] Inventor: Robert G. Thomson, Tempe, Ariz.

[73] Assignee: GTE Communication Systems Corporation, Phoenix, Ariz.

[21] Appl. No.: 783,995

[22] Filed: Oct. 4, 1985

[51] Int. Cl.[4] .............................................. H03F 3/18

[52] U.S. Cl. .................................... 330/257; 323/316; 330/288

[58] Field of Search ................ 330/257, 288; 323/315, 323/316; 307/297

[56] References Cited

U.S. PATENT DOCUMENTS 3,962,592 6/1976 Thommen et al. ............. 323/315 X 4,437,023 3/1984 Gill, Jr. ........................... 323/315 X

*Primary Examiner*—James B. Mullins

*Attorney, Agent, or Firm*—John A. Odozynski

[57] ABSTRACT

A differential amplifier feedback current mirror includes a feedback current source that provides a correction current to one input of a differential amplifier. The correction current is synthesized by comparing a sample of the current delivered by a string of controlled current sources to a reference current set up by a constant current source. A current driver is included in the differential amplifier feedback loop and a current source buss is driven by the current driver. The feedback configuration assures that the current delivered by the dependent controlled current sources accurately tracks the current established by the reference current source, irrespective of the base current offset attributable to each of the dependent controlled current sources.

5 Claims, 2 Drawing Figures

PRIOR ART

DIFFERENTIAL AMPLIFIER FEEDBACK CURRENT MIRROR

TECHNICAL FIELD

This invention relates to integrated circuit design techniques and, more particularly, to a current mirror configuration that minimizes offsets derived from base drive requirements.

BACKGROUND OF THE INVENTION

The current mirror circuit configuration has found widespread use as an integrated circuit design technique and its operation is well-known to practitioners in the art. In a canonical form as depicted in FIG. 1, the current mirror includes a current drive transistor, shown as Q1 in FIG. 1, whose current I1 is externally fixed or forced in some manner, for example, through the use of a constant current source. The base of Q1 is then attached to a string of controlled current sources Q2, . . . , Qn. If transistors Q1, . . . , Qn are fabricated from an integral piece of semiconductor material, then their Vbe and emitter current characteristics will match. And, if R1=R2= . . . =Rn and if the base-emitter areas are of the same size, then I1=I2= . . . =In. It is also understood that the emitter resistors and emitter areas may be "ratioed" so that the controlled currents, I2, . . . , In, may be set at a predetermined fixed multiple or fixed fraction of I1.

However, in any event it may be seen that I1 contains a current component attributable to the sum of the base currents of I2, . . . , In. If the string of dependent current sources is long (n large) or if the beta's of the transistors are low, as would likely be the case were these devices laterally diffused transistors, then the base drive component of I1 will become large. In this case the assumption I1=I2= . . . =In is no longer valid and the current delivered by the controlled current sources will deviate from the predetermined predicted current.

The thrust of the subject invention is a technique for eliminating this error. With reference to FIG. 1, the technique can be understood as a departure according to which I2 is compared in a feedback loop to the predetermined intended current. Deviations in the value of I2 from the intended value cause an error signal to be developed. The error signal is then used to adjust the drive to Q1 so that the value of I2, as well as the values of the other current sources in the string, are forced back toward the intended value.

DISCLOSURE OF THE INVENTION

The above and other objects, advantages and capabilities are achieved in one aspect of the invention by a Differential, Amplifier Feedback Current Mirror for driving a plurality of dependent current sources. The current mirror comprises a differential amplifier having a first input coupled to a threshold circuit for establishing a quiescent current flow in the amplifier. A second input of the differential amplifier is coupled to a current reference. A current driver is coupled to the output of the differential amplifier and is also coupled via a buss to a string of dependent current sources as well as to the current reference.

The current mirror is so arranged and constructed that deviations in the current delivered by the dependent current sources from predetermined values are reflected in the current delivered by the current reference to the differential amplifier. As a result, the current provided by the differential amplifier to the current driver is modified in a negative-feedback manner so that the drive to the dependent current sources is appropriately adjusted. This technique eliminates errors that otherwise occur in the standard current mirror configuration. To wit: base drive to the dependent current sources accumulates in the current driver and causes an offset from the desired current delivered by the dependent current sources.

DESCRIPTION OF A PREFERRED EMBODIMENT

Figure 1:
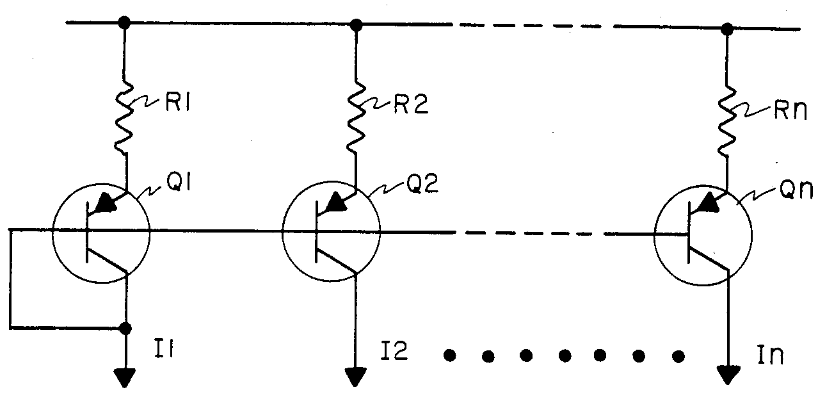
FIG. 1 illustrates the canonical form of the stand current mirror circuit configuration.
Figure 2:
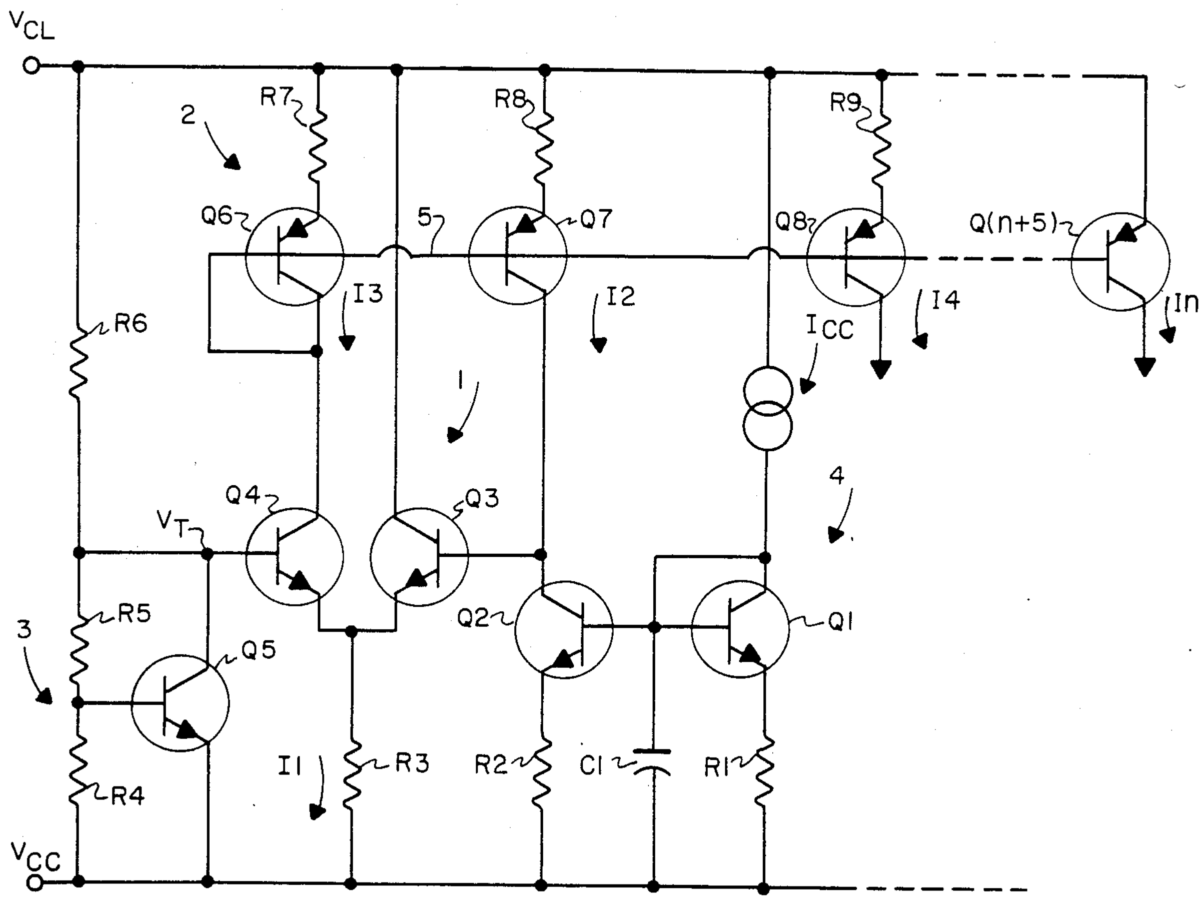
FIG. 2 is a detailed schematic diagram of the subject Differential Amplifier Feedback Current Mirror.

For a comprehensive understanding of the subject Differential Amplifier Feedback Current Mirror, reference is made to the following disclosure and appended claims in conjunction with the above-described drawing.

Referring now to the drawing, the Differential Amplifier Feedback Current Mirror is seen to include a differential amplifier 1 coupled between a first voltage supply, Vcc, and a second supply voltage, Vee. The differential amplifier includes NPN transistors Q3 and Q4 having their emitters coupled in common through resistor R3 to Vee. The collector of Q3 is coupled directly to Vcc; whereas the collector of Q4 is coupled to Vcc through a current driver 2 that includes a PNP transistor Q6 and resistor R7. Q6 has its collector and base coupled to the output of the differential amplifier at the collector of Q4. The emitter of current driver transistor Q6 is coupled to Vcc through resistor R7.

The first input of the differential amplifier, at the base of Q4, is coupled to a threshold circuit 3 that includes transistor Q5 and resistors R4, R5, and R6. Q5 collector is coupled to the base of Q4 and Q5 emitter is coupled to Vee. R6 is coupled from Vcc to Q5 collector; R5 is coupled between the collector and base of Q5; R4 is coupled between the base of Q5 and Vee. The purpose of the threshold circuit is to establish a voltage, VT, at the base of Q4 which, in conjunction with R3, determines the combined emitter currents of Q4 and Q3. This current, shown as I1 is the drawing, can be easily shown to have a magnitude approximately equal to (Vbc)(R5)/(R3)(R4). I1 is established at a level sufficient to prevent the saturation of Q4 under worst-case current drive conditions.

The second input of the differential amplifier, at the base of Q3, is coupled to a feedback current source 4 that includes a constant current source Icc, a primary controlled current source including transistor Q7, and a pair of transistors, 35 Q1 and Q2, arranged in a current mirror configuration. Icc is coupled at one end to Vcc and at another end to the collector and base of transistor Q1 so that a collector current of a magnitude approximately equal to Icc is set up in Q1. Q1 emitter is coupled to through resistor R1 to Vee and Q1 base is coupled in a current mirror configuration to the at the base of Q2. Q2 has a collector coupled to the second input of the differential amplifier and an emitter coupled through a resistor R2 to Vee. The collector of Q2 is also coupled to the collector of PNP transistor Q7. Q7, in turn, has an emitter coupled through a resistor R8 to Vcc. The base of Q7 is coupled to a dependent controlled current source buss 5 that couples Q7 to current drive transistor Q6. The current buss also can be seen to couple Q6 to a string of dependent controlled current sources Q8, . . . , Qn+5.

Operation of the subject differential feedback controlled current mirror is as follows. Constant current source Icc forces a substantially equivalent current flow in the emitter of Q1. The (Q1, Q2) current mirror configuration dictates that the emitter current of Q2 be equal to the emitter current of Q1, that is, Icc. With the simplifying assumption that Q2 collector and emitter currents are equal, it can be seen that the current input to Q3 is equal to I2 less Icc, where I2 is the collector current of Q7. However, Q7 is coupled by the current buss to controlled current sources Q8, . . . , Qn+5 so that the current flowing in Q7 accurately reflects the current flowing in the controlled current sources. In practice the emitter resistors of the controlled current sources may be "ratioed" to R8 and their respective emitter areas ratioed to the emitter area of Q7 so that Q7 emitter current is, as desired, a constant multiple or constant fraction of the controlled current source emitter currents.

Ideally, the drive current provided by Q6 to the controlled current sources will be such that I2 will equal Icc and equilibrium will exist. As can be seen from the drawing the base drive currents for Q7 and for the controlled current sources accumulate in Q6 base current. Should Q6 base current become large, a material offset will exist in the bias provided via buss 5 to the controlled current sources. This offset will directly result in a deviation in the current delivered by the controlled current sources from the predetermined desired values. However, the current mirror is configured to operate in a negative-feedback mode so as to circumvent the effects attributable to the Q6 base current component.

Specifically, as Q6 base current becomes large, its emitter current will increase, thereby causing excessive voltage drops across R9, . . . , R(n+6), the controlled current source emitter resistors and excessive delivered currents I4 . . . I(n). However, because Q7 is mirrored to the dependent current sources, I2 will increase concomitantly. Because Q2 collector current is clamped at Icc, correction current, roughly equal to the difference between I2 and Icc, will be developed at the input of the differential amplifier. As a result, the base drive to Q3 at the input of the differential amplifier must necessarily increase. As this occurs a greater proportion of R3 current will be diverted from Q4 to Q3, directly reducing the base drive to the current source transistor Q6. The base drive to the controlled current sources is reduced accordingly so that the necessary correction is effected.

Accordingly, although there has been shown and described what at present is considered to be a preferred embodiment of a differential, feedback-controlled current mirrors, it will be obvious to those having ordinary skill in the art that various changes and modifications may be made therein without departure from the scope of the invention as defined by the appended claims.

What is claimed is:

1. A differential amplifier feedback current mirror for driving at least one dependent controlled current source, the current mirror comprising:

a differential amplifier having first and second inputs;

a threshold circuit coupled to the first input of the differential amplifier;

a current driver coupled to an output of the differential amplifier;

a current bus coupled to the current driver and to the dependent controlled current source for providing bias and current drive to the dependent controlled current source; and a reference current source coupled to the second input of the differential amplifier, the reference current source comprising:

a first transistor (Q7) having a first electrode for coupling to a first voltage supply, a second electrode coupled to the current bus, and a third electrode coupled to the second input of the differential amplifier;

a second transistor (Q2) having a first electrode for coupling to a second voltage supply, a second electrode, and a third electrode coupled to the second input of the differential amplifier; and a third transistor (Q1) having a first electrode for coupling to a voltage supply, a second electrode coupled to the second electrode of the second transistor, and a third electrode; and a constant current source coupled at a first end to the third electrode of the third transistor and at a second end to a voltage supply, wherein the current mirror is so arranged and constructed that changes in the current delivered by the dependent controlled current source are reflected in the current delivered by the current reference to the differential amplifier so that drive current provided by the differential amplifier to the current driver is accordingly modified in a negative-feedback fashion.

2. A differential amplifier feedback current mirror as defined in claim 1 wherein the reference current source normally provides current into the second input of the differential amplifier.

3. A differential amplifier feedback current mirror as defined in claim 2 further comprising a capacitance coupled to the second electrodes of the second and third transistors and coupled to a voltage supply.

4. A reference current source for providing at an output of the reference current source a reference current that varies in accordance with the current delivered by a current driver, the reference current source comprising:

a first transistor (Q7) having a first electrode for coupling to a first voltage supply, a second electrode coupled to the current driver, and a third electrode coupled to the output of the reference current source;

a second trasistor (Q2) having a first electrode for coupling to a second voltage supply, a second electrode, and a third electrode coupled to the output of the reference current source; and a third transistor (Q1) having a first electrode for coupling to a voltage supply, a second electrode coupled to the second electrode of the second trasistor, and a third electrode; and a constant current source that provides a constant current, independent of the current driver, and that is coupled at a first end to the third electrode of the third transistor and at a second end to a voltage supply.

5. A reference current source as defined in claim 4 further comprising a capacitance coupled to the second electrodes of the second and third transistors and coupled to a voltage supply.

* * * * *